US006564347B1

(12) United States Patent
Mates

(10) Patent No.: US 6,564,347 B1
(45) Date of Patent: May 13, 2003

(54) METHOD AND APPARATUS FOR TESTING AN INTEGRATED CIRCUIT USING AN ON-CHIP LOGIC ANALYZER UNIT

(75) Inventor: John W. Mates, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/364,326

(22) Filed: Jul. 29, 1999

(51) Int. Cl.[7] .............................................. G01R 31/28
(52) U.S. Cl. ...................................... 714/727; 714/724
(58) Field of Search ........................ 713/600; 714/732, 714/725, 39, 37, 727, 728, 731, 733, 738, 724

(56) References Cited

U.S. PATENT DOCUMENTS

| 5,144,525 | A | * | 9/1992 | Saxe et al. ..................... 365/45 |
| 5,504,756 | A | | 4/1996 | Kim et al. |
| 5,574,733 | A | | 11/1996 | Kim |
| 5,757,818 | A | | 5/1998 | Ashuri |
| 5,796,282 | A | | 8/1998 | Sprague et al. |
| 5,872,795 | A | | 2/1999 | Parvathala et al. |
| 5,968,181 | A | * | 10/1999 | Tomioka ..................... 713/600 |
| 5,993,055 | A | * | 11/1999 | Williams ..................... 714/732 |
| 6,016,563 | A | * | 1/2000 | Fleisher ..................... 714/725 |
| 6,097,232 | A | * | 8/2000 | McKinney .................. 327/270 |
| 6,182,247 | B1 | * | 1/2001 | Herrmann et al. ............ 714/39 |
| 6,212,652 | B1 | * | 4/2001 | Williams ..................... 714/37 |
| 6,286,114 | B1 | * | 9/2001 | Veenstra et al. .............. 714/39 |

OTHER PUBLICATIONS

Texas Instruments; IEEE Std 1149.1 (JTAG) Testability; 1997 Semiconductor Group; pp. 77.

* cited by examiner

Primary Examiner—David Ton
(74) Attorney, Agent, or Firm—Cynthia T. Faatz

(57) ABSTRACT

An on-chip logic analyzer unit. An integrated circuit includes a programmable logic analyzer unit embedded within the integrated circuit to test a function of the integrated circuit.

24 Claims, 3 Drawing Sheets

METHOD AND APPARATUS FOR TESTING AN INTEGRATED CIRCUIT USING AN ON-CHIP LOGIC ANALYZER UNIT

BACKGROUND

1. Field

An embodiment of the present invention relates to the field of testing integrated circuits and more specifically, to an on-chip logic analyzer unit (LAU).

2. Discussion of Related Art

Once an integrated circuit, such as a microprocessor, has been designed and fabricated, the integrated circuit is tested to determine whether it functions as intended and to define the environmental parameters (e.g. die temperatures, power supply noise, voltage levels and/or core clock frequencies) within which it functions as intended.

For post-fabrication validation testing, for example, a logic analyzer may be used to perform a particular level of functional testing. In general terms, a logic analyzer is connected to a device to be tested using one or more probes. A processor in the logic analyzer executes instructions in response to commands received via a logic analyzer user interface. The executed instructions cause the logic analyzer to stimulate the device being tested via the one or more probes with one or more test signals, referred to herein as signal vectors.

In response to receiving a signal vector from the logic analyzer, the device under test generates one or more response signal vectors that are sent to the logic analyzer via the probes and may be displayed on a logic analyzer display. Pass/fail functionality of the device under test may be determined by comparing reference signal vectors stored by the logic analyzer with the response signal vectors received from the device under test.

In order to test an integrated circuit effectively, a logic analyzer should be capable of applying and receiving signal vectors at a rate at least equal to the desired operating speed of the integrated circuit being tested. Thus, as the operating clock frequency of each generation of integrated circuits continues to increase, logic analyzers used to test integrated circuits must also become faster.

As logic analyzers (and other similar testers) increase in speed, however, they also increase in cost and design complexity. Additionally, most integrated circuit manufacturers purchase logic analyzers from external vendors who may have difficulty producing products that meet the integrated circuit manufacturers technical requirements in a timely manner. Further, using logic analyzer probes, it may not be possible to access all of the signals that are desirable to test.

To improve testability, many integrated circuits include "design for testability" (DFT) features that provide for embedded testing of certain integrated circuit functions. Some of these features may be compatible with the IEEE standard 1149.1-1990, IEEE Standard Test Access Port and Boundary-Scan Architecture produced by the Joint Test Action Group (JTAG), often referred to simply as JTAG. An integrated circuit device designed in accordance with IEEE Std. 1149.1 provides for test instructions and data to be serially transferred into the device and response data to be serially transferred out of the device using four extra pins included specifically for this purpose.

Other examples of DFT features include scan chains for testing circuits including sequential logic, specialized state machines for generating test patterns for specific circuitry and cyclic redundancy check (CRC) bits to verify programmable circuitry.

DFT features may provide for testing of integrated circuits, including circuits internal to a chip, that are difficult to access using external test equipment. While DFT features can facilitate testing of particular integrated circuit functions, the testing capabilities of each feature may be limited in scope. Thus, DFT features often provide a piecemeal approach to integrated circuit testing.

Built-In Self-Test (BIST) capability (another DFT feature) is also included in many integrated circuit devices. BIST is typically implemented as a microcoded program in microcode Read Only Memory (ROM) to exercise the microarchitectural elements of the host integrated circuit to determine whether they logically operate as specified. Because BIST is a firmware tool, it is relatively inflexible. Further, BIST typically only produces a pass/fail indication such that further and more extensive testing (possibly using an external logic analyzer) must be performed to determine a contributing circuit failure, for example.

SUMMARY OF THE INVENTION

A method and apparatus for testing an integrated circuit are described. In accordance with one embodiment, an apparatus comprises a programmable logic analyzer unit (LAU) embedded within an integrated circuit. The programmable LAU tests a function of the integrated circuit.

Other features and advantages of the present invention will be appreciated from the accompanying drawings and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for testing an integrated circuit are described. In the following description, particular types of integrated circuits, integrated circuit configurations and systems are described for purposes of illustration. It will be appreciated, however, that other embodiments are applicable to other types of integrated circuits, and to systems and integrated circuits configured in another manner.

For one embodiment, an integrated circuit may be tested using an on-chip logic analyzer unit (LAU). In this manner, for validation testing, for example, an external logic analyzer does not need to be used.

The on-chip LAU may provide most of the functionality of current, external logic analyzers while being capable of scaling with the speed of the integrated circuit being tested. Further, the on-chip LAU of one embodiment provides for more comprehensive on-chip testing capabilities than prior embedded design for testability (DFT) features. Additionally, by being programmable, test routines can be added after manufacture of the integrated circuit to be tested.

Figure 1:
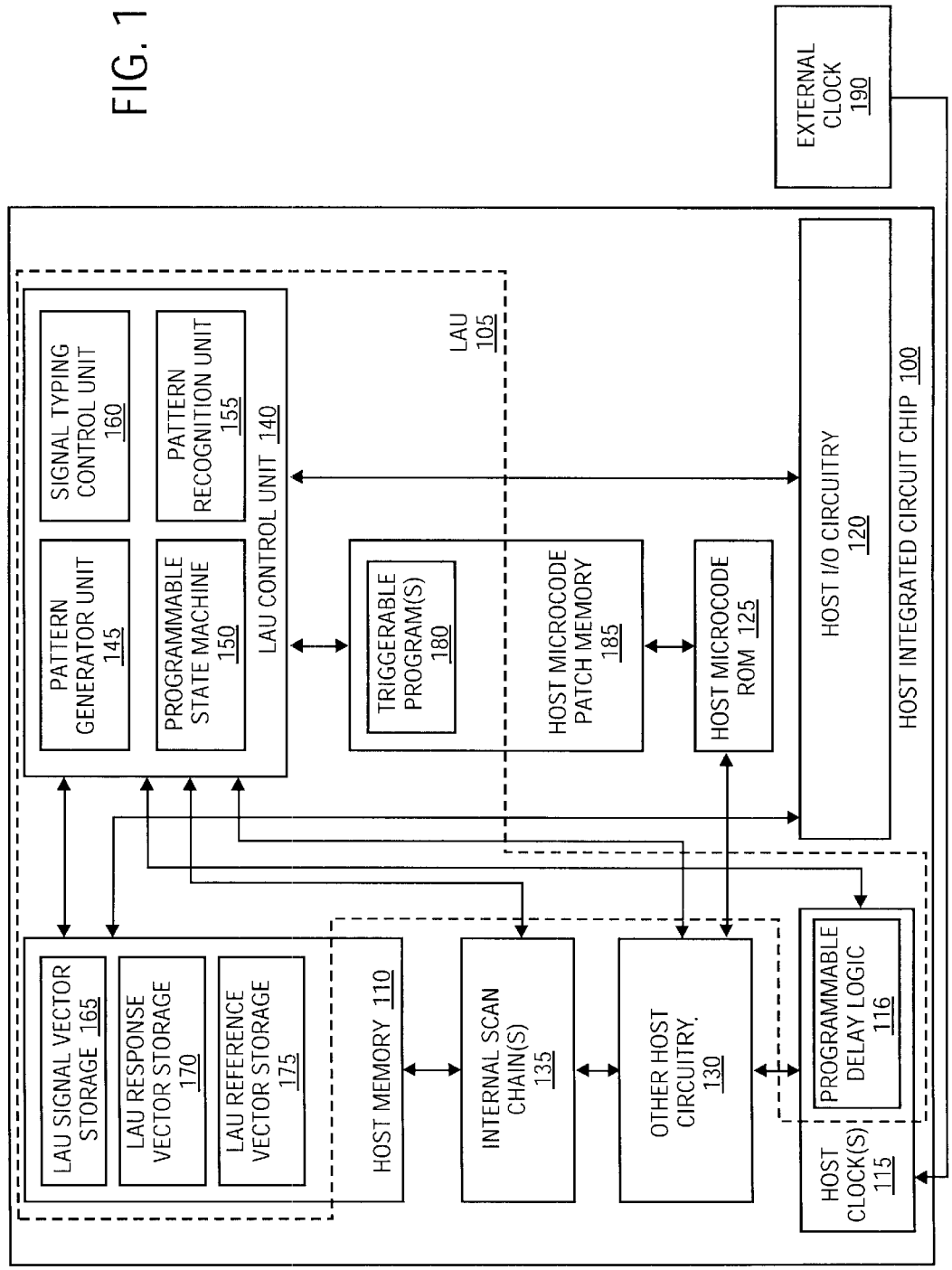
FIG. 1 is a block diagram of an LAU embedded within an integrated circuit according to one embodiment.

FIG. 1 is a block diagram showing an example of an integrated circuit chip 100 including an on-chip LAU 105 according to one embodiment. The integrated circuit 100 of FIG. 1 is a processor for purposes of illustration, but other embodiments are applicable to other types of integrated circuits.

The integrated circuit 100, in this example, includes a host memory 110, one or more host clocks 115 and associated programmable delay logic 116, host input/output (I/O) circuitry 120, a host microcode read only memory (ROM) 125 and other host circuitry 130. One or more internal scan chain(s) 135 may also be included for testability purposes. The internal scan chain(s) 135 may be provided to test specific logic on the host IC 100, for example.

For one embodiment, host I/O circuitry 120 includes boundary scan and test access port circuitry in accordance with the IEEE Std. 1149.1-1990, or JTAG specification as described above. For other embodiments, other types of circuits that provide access to input and/or output signals on the host chip 100 (including dedicated LAU I/O circuitry) may be coupled to the LAU 105 to enable the LAU 105 to write and read test vectors to and from pins of the host chip 100.

The embedded LAU 105 of one embodiment includes an LAU control unit 140. The LAU control unit 140 controls the operation of the on-chip LAU 105 and may include a pattern generator unit 145, a programmable state machine 150, a pattern recognition unit 155 and a signal typing control unit 160. The function of each of these units is described in more detail below.

For one embodiment, the LAU control unit 140 is implemented using a microprocessor core. Examples of microprocessor cores that may be used for various embodiments include an i386 processor core from Intel Corporation of Santa Clara, Calif., an Advanced RISC Machines (ARM) processor core designed by Advanced RISC Machines Ltd. of Cambridge, England, or a Z80 processor core from ZiLOG, Inc. of Campbell, Calif. For another embodiment, the LAU control unit 140 may be implemented using a custom microcontroller core. Other types of processor cores or controller logic may be used for other embodiments.

The LAU 105 of one embodiment also includes memory for storage of signal, response and/or reference vectors during testing of the host integrated circuit chip 100. For one embodiment, these vectors are stored in the host memory 110 in an LAU signal vector storage area 165, an LAU response vector storage area 170 and/or an LAU reference vector storage area 175, respectively. For this embodiment, the host memory 110 is also used by the host integrated circuit chip 100 for another purpose. The host memory 110 may be an on-chip cache memory, register memory, or translation lookaside buffer, for example. For another embodiment, a separate, dedicated memory for use only by the LAU 105 is provided for vector storage.

For some embodiments, the LAU 105 may include additional memory for storing one or more triggerable program(s) 180 that are executed in response to the occurrence of predetermined signal pattern(s). A writeable microcode patch memory segment 185 may be provided on the host chip 100 to correct microcode or other errors in the host chip 100. For one embodiment, one or more triggerable program(s) 180 may be programmed into the host microcode patch memory segment 185 and implemented as a state machine, for example using well-known programming techniques. For other embodiments, one or more of the triggerable program(s) 180 may be stored in another memory in the LAU 105 (such as a dedicated LAU memory or LAU writeable microcode memory, if included) or elsewhere on the host chip 100.

The LAU 105 may also include clocking circuitry and programmable clock delay logic. For one embodiment, the LAU 105 uses the host clock(s) 115 and associated programmable delay logic 116 to control testing of the host integrated circuit chip 100.

Figure 2:
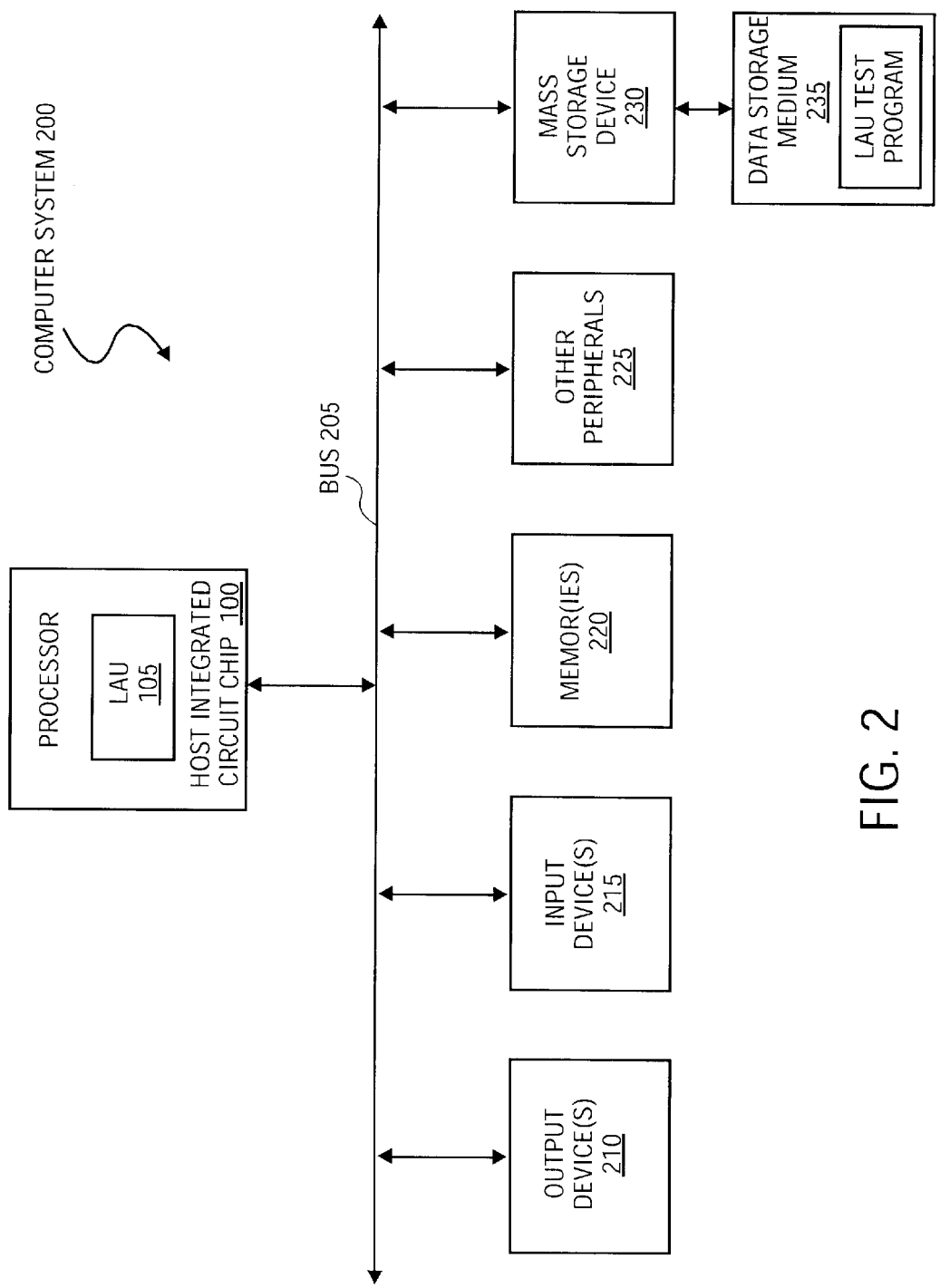
FIG. 2 is a block diagram of a system in which the embedded LAU of FIG. 1 may be used.

An example of a desktop computer system 200 in which the host integrated circuit chip 100 may be included is shown in FIG. 2. For this example, the host integrated circuit chip 100 is a microprocessor as described above. The processor 100 is coupled to a bus 205 that communicates information between the processor 100 and other components in the computer system 200. Also coupled to the bus 205 are an output device 210, such as a monitor or printer, one or more input devices 215, such as a keyboard and/or a cursor control device, one or more memories 220, other peripherals 225 (e.g. memory controller, bus bridge, etc.), and a mass storage device 230.

The mass storage device 230 may be a hard disk drive, a compact disc read only memory (CD ROM) drive or an optical disk drive, for example. A corresponding data storage medium 235 may be used to store instructions, data and/or one or more programs to be executed by the processor 100.

For one embodiment, the computer system 200 is a computer system in which the LAU 105 is used to perform functional or validation testing of the processor 100. During such testing, the input device(s) 215 and the output device(s) 210 operate as a user interface for the LAU 105. A user may control testing of the processor 100 by the LAU 105 via the input device(s) 215 and results of the testing may be viewed using the output device(s) 210.

It will be appreciated that, for other embodiments, a host integrated circuit chip with an on-chip LAU, such as the host chip 100, may be used in other types of systems including other types of computer systems.

Using some or all of the above-described circuit blocks and components, the on-chip LAU 105 of one embodiment can perform many of the same functions as currently available logic analyzers that are external to a chip to be tested. Some examples of these capabilities are described in more detail below with continuing reference to FIGS. 1 and 2.

As described above, for one embodiment, the LAU 105 is coupled to input and output pins or pads of the host chip 100 via the host I/O circuitry 120, and may be coupled to some internal host chip 100 circuitry via one or more internal scan chains 135. The LAU 105 may also be coupled to other internal circuitry by direct connections to various nodes within the host chip 100 and/or by multi-way switches (muxes), for example, that allow for selective connections to host chip 100 nodes based on a test to be performed. Other approaches to coupling the LAU 105 to signal lines, buses, nodes and/or circuits to be tested may also be used for various embodiments.

A designer of the host integrated circuit chip 100, for example, may choose the types and locations of connections between the LAU 105 and internal host chip 100 circuitry based on circuits and signal lines desired to be tested. In this manner, the LAU 105 of some embodiments is capable of testing circuit implementations, signal lines etc. that may not easily be tested by other types of test circuitry. Thus, in contrast to BIST firmware, for example, the LAU 105 may probe arbitrary wires in the circuit implementation of a microarchitecture rather than being limited to testing the logical operation of microarchitectural elements. Further, the LAU 105 of some embodiments is capable of examining physical as well as logical aspects of the events in wires and memory elements of the host IC 100. Additionally, the programmable nature of the LAU 105 makes it quite flexible in terms of varying tests to be performed, etc. in comparison to BIST routines. While BIST routines produce a pass/fail indication, the LAU 105 may be used as a debugging tool to observe operation of the host IC 100 at a lower level.

In operation, a user may initiate a test of the host integrated circuit chip 100 by the LAU 105 via the input device(s) 215 of the computer system 200. Such an input signal may be received by the LAU 105 via the bus 205 and the host I/O circuitry 120. A specific test to be performed may be indicated by the user. Alternatively, the programmable state machine 150 may perform a predetermined test sequence in response to a test signal, for example, that is either initiated by the user or is responsive to given conditions within the host integrated circuit chip 100.

When a test operation or sequence is initiated, one or more signal vectors are applied to one or more circuits under test on the host chip 100. The LAU control unit 140 may retrieve the one or more signal vectors from LAU signal vector storage memory 165. The signal vectors stored in the LAU signal vector storage memory 165 may be generated by the pattern generator unit 145 and stored in the memory 165 upon initiating a test mode on the host integrated circuit chip 100, for example. Alternatively, the signal vectors may be stored in the LAU signal vector storage memory 165 by a program that is stored in a memory or data storage medium of the computer system 200 and executed by the host chip 100 or another component in the computer system 200. For another embodiment, the pattern generator unit 145 may generate signal vector(s) to be applied based upon a test to be performed without storing the signal vector(s) in the LAU signal vector storage memory 165.

It will be appreciated that some of the units, such as the pattern generator unit 145, within the LAU control unit 140 may be implemented in dedicated hardware that is set up and controlled by the LAU control unit 140. Alternatively, the pattern generator 145 and/or other units within the LAU control unit 140 may be implemented using the existing capabilities of a microprocessor core that is used to implement the LAU control unit 140. Other approaches to providing the functions of the units within the LAU control unit 140 are within the scope of various embodiments.

In response to stimulating host chip 100 circuitry with signal vector(s) during testing, one or more response vector(s) may be returned to the LAU 105 from the circuit(s) under test. The response vector(s) may be displayed to a user via the output device(s) 210 and/or stored in the LAU response vector storage memory 170. If the response vector(s) are displayed, they may be communicated from the chip 100 to the output device(s) 210 via the host I/O circuitry 120 and the bus 205. For some tests, the response vector(s) may be compared to corresponding reference vector(s) stored in the LAU reference vector storage memory 175 to determine whether the host chip 100 passed or failed the particular test being performed. For other tests, a pass/fail determination may be based on response timing as determined by one of the host clocks 115 or a shifted clock signal, for example.

The particular circuit(s) to be tested and signal vector(s) to be applied are controlled by the programmable state machine 150 and/or a test program segment that is stored in a memory of the LAU 105 or on the host chip 100. The test program segment may be written using any language convenient for compiling into the machine language of the LAU control unit 140. The programmable state machine 150 may be programmed through a microcode patch memory, for example, such as the host microcode patch memory 185, using the host microcode language. Other programming approaches may be used for various embodiments.

The application of the signal vector(s) is controlled by the LAU control unit 140 in conjunction with a clock signal. LAU 105 clocking may be implemented using any logical combination of external and internal host and LAU clocks.

For one embodiment, the LAU control unit 140 may use one or more of the host clock(s) 115 to control timing of the application of signal vectors and to determine response times for response vectors received from circuit(s) under test. It may be desirable, for example, for the LAU 105 to use the fastest available host clock 115 as an LAU sampling clock. In this manner, the LAU 105 can test host integrated circuit chip 100 circuit(s) at the fastest host clock rate as well as being able to test host circuits clocked at slower rates.

For some embodiments, the LAU control unit 140 may also shift a clock edge of a host clock signal 115 by controlling the programmable delay logic 116. The resulting shifted host clock signal may be used to measure margin associated with a particular host integrated circuit chip 100 function, for example.

Also, for some embodiments, a dedicated LAU 105 clock (not shown) that provides for internal clocking at several fractions and/or an external clock 190 may be used to control testing. The external clock 190 may, for example, be coupled to drive the host clocks 115 via an external pin of the host chip 100. A multiplexed pin may be provided in some embodiments to provide for the external clock connection.

For another embodiment, an external clock may be coupled to the host integrated circuit chip 100 through a test access port in the host I/O circuitry 120, for example. Other types of external clocks and/or approaches to coupling the external clock to LAU 105 circuitry may also be used.

The ability to use an external clock for some embodiments may provide some independence for the LAU 105 from the host chip 100 such that the likelihood of post-silicon functionality of the LAU 105 may be increased and/or the functionality of the LAU 105 may be more easily measured.

In accordance with some embodiments, the LAU control unit 140 includes the capabilities to use triggers and/or filters to control or initiate test sequences. A trigger may be specified in terms of a logic equation or a particular condition, for example. A trigger may be used to determine when a particular test sequence should be initiated or when particular signal vector should be applied. For example, a trigger may be used to cause a particular set of signal vectors to be applied to a given circuit under test when a clock frequency reaches 500 MHz and a memory is turned off. It will be appreciated that many other conditions or combinations of conditions may be used to define a trigger. A trigger may be implemented by the programmable state machine 150 or through a program segment stored in a memory of the LAU 105 (e.g. the host microcode patch memory 185) or in a memory on the host chip 100 or computer system 200.

A filter is typically used to recognize a pattern in one or more signals being monitored. A filter may be set, for example, to determine when an address reaches a predetermined value. In response to the occurrence of the specified condition, a particular test sequence may be performed. A filter may be implemented using the pattern recognition unit 155 of the LAU 105. Alternatively, a filter may be implemented using a program segment that is stored in a memory of the LAU 105 or the host chip 100.

The LAU control unit 140 may also implement other common control functions (which may make use of triggers and/or filters) such as "branch on match," "loop until," and "call to a subroutine," for example, to control testing of the host chip 100. These control functions may be implemented using the programmable state machine 150, the pattern recognition unit 155 and/or through a control program segment stored in a memory of the LAU 105, the host chip 100 or the computer system 200.

The LAU 105 of one embodiment is also capable of driving and sensing various types of signals and logic used by the host chip 100. For one embodiment, the signal typing control unit 160 enables the LAU 105 to test edge-triggered and/or level-sensitive logic. Further, for some embodiments, the signal typing control unit 160 enables the LAU 105 to drive and sense signals that are positive or negative pre-charged signals, with and without retention and/or tristated signals, with and without retention. Additional types of signals are within the scope of various embodiments. This variety of available signal types provides the LAU 105 with flexibility in terms of the types of tests that can be performed.

Additionally, the LAU 105 of some embodiments is capable of reading from and/or writing to any host chip 100 memory elements to be tested, whether they are implemented as latches, flip-flops, registers or memory.

As described above, the on-chip LAU provides many of the capabilities of currently available, external logic analyzers. The on-chip LAU of one embodiment, however, scales in performance with host integrated circuit technology. More specifically, the on-chip LAU is fabricated using the same technology as the host chip, may be clocked using host chip clocks and, thus, can keep pace with the technology to be tested.

Further, the functions provided by external logic analyzers change slowly as compared to corresponding advances in integrated circuit functionality and technology. Assuming this trend continues, the number of transistors used to implement an on-chip LAU in accordance with various embodiments will not increase as quickly as the number of transistors in host integrated circuits to be tested. Thus, the on-chip LAU may take up a smaller percentage of chip real estate as host chips continue to increase in complexity. The LAU of one embodiment may be implemented as a standard cell that can easily be used in the design of many integrated circuits.

Some embodiments of the on-chip LAU may be designed and validated more robustly than the host integrated circuit to be tested. In this manner, the incidence of LAU failures may be reduced thereby increasing the likelihood that a defective host chip can be analyzed by its own functional, on-chip LAU.

Using embedded LAUs in integrated circuits in accordance with the invention, integrated circuit manufacturers and testers may be able to realize significant savings related to test equipment by obviating a need for costly, external logic analyzers. As a need for external logic analyzers is reduced, so are the costs associated with maintenance, repair, etc.

The on-chip LAU of various embodiments may further enable each chip on which it is included to analyze itself. Built-In Self-Test (BIST) routines may be enhanced to contain tests that use the functions and capabilities of the embedded LAU as described above.

Using the on-chip LAU of one embodiment, it may also be possible to debug a host integrated circuit from a remote site. A test program that makes use of on-chip LAU test capabilities may be downloaded over a network to a system including the host integrated circuit chip and stored in, for example, the data storage medium 235 of FIG. 2. The test program, when executed by a processor, may control the LAU to test various functions of the host integrated circuit chip and display on an output device coupled to the system a result indicating specific test failures. This capability may be particularly useful for systems that are otherwise difficult to access such as a space shuttle, for example.

Other advantages and uses of the embedded LAU of various embodiments will also be appreciated from the previous description.

Figure 3:
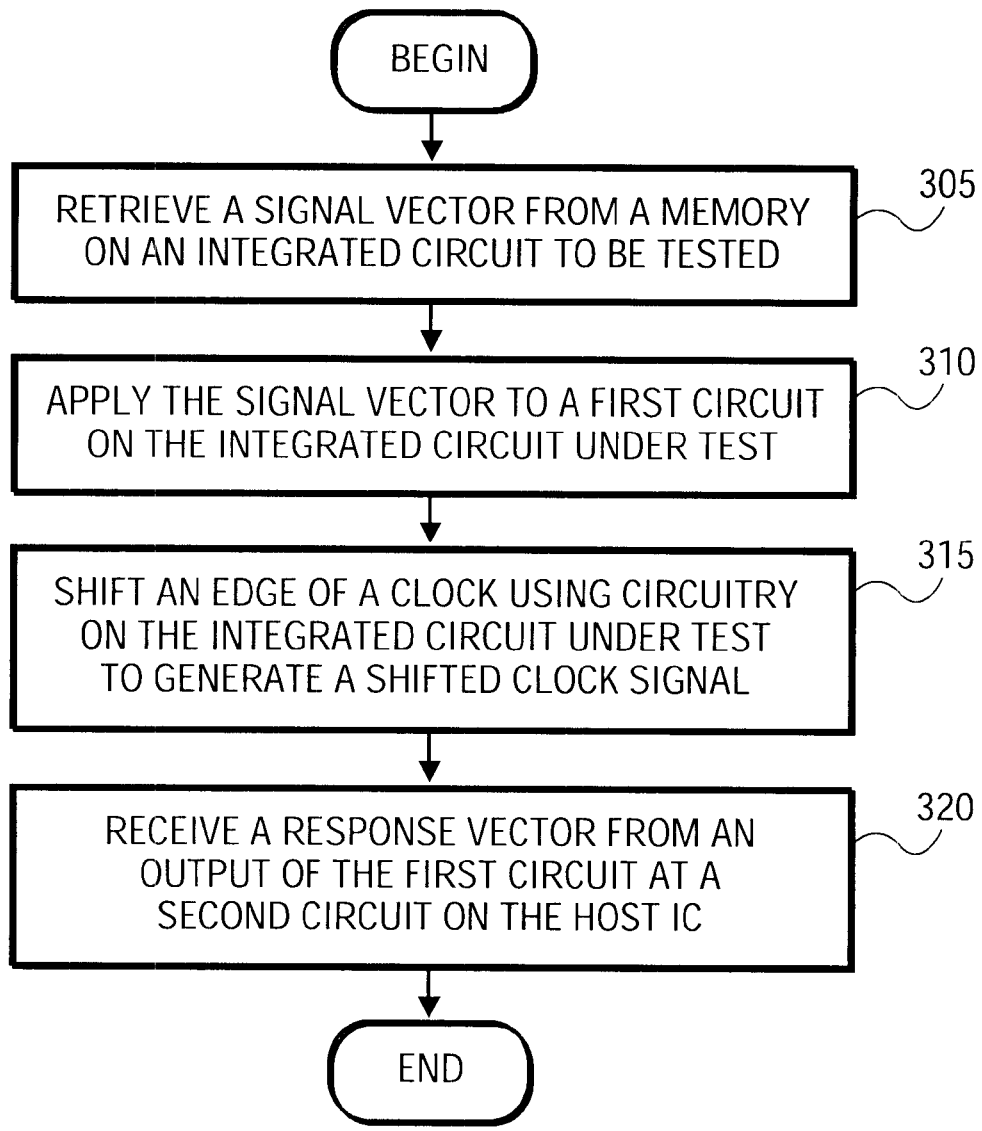
FIG. 3 is a flow diagram showing a method for testing an integrated circuit in accordance with one embodiment.

Referring now to FIG. 3, one embodiment of a method for testing integrated circuits is described.

At processing block 305, a signal vector is retrieved from a memory on an integrated circuit to be tested. For one embodiment, the signal vector may be retrieved in response to a test program, user input, or a trigger or filter function, for example. Further, for one embodiment, the signal vector is stored in the memory after manufacture of the integrated circuit to be tested.

At processing block 310, the signal vector is applied to an input of a first circuit to be tested on the integrated circuit.

At processing block 315, an edge of a clock signal on the integrated circuit is shifted, using on-chip circuitry, to generate a shifted clock signal. The shifted clock signal may be used to measure margin for a particular signal being tested, for example. At processing block 320, a response vector is received from the first circuit by a second circuit on the integrated circuit. For one embodiment, the response vector may be stored in a memory on the integrated circuit and/or displayed to a user.

For other embodiments, additional actions may be included such as measuring a response time of a circuit under test using the shifted clock signal and/or applying the signal vector in response to the shifted clock signal.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An integrated circuit comprising:
   a programmable logic analyzer unit embedded within the integrated circuit, the programmable logic analyzer unit to test a function of the integrated circuit; and
   programmable clock delay logic being programmable by the logic analyzer unit to generate a shifted clock signal in response to receiving an input clock signal.

2. The integrated circuit of claim 1 further comprising:
   a memory coupled to the programmable logic analyzer unit, the memory to store a vector for use by the programmable logic analyzer unit during testing of the integrated circuit.

3. The integrated circuit of claim 1 further comprising:
   input/output circuitry coupled to the programmable logic analyzer unit, an input of the integrated circuit and an output of the integrated circuit, the programmable logic analyzer to stimulate the input and receive a response from the output via the input/output circuitry.

4. The integrated circuit of claim 3 wherein the input/output circuitry includes boundary scan circuitry.

5. The integrated circuit of claim 1 wherein the programmable logic analyzer unit comprises:
   a logic analyzer control unit; and
   a vector storage memory coupled to the logic analyzer control unit.

6. The integrated circuit of claim 5 wherein the logic analyzer control unit comprises:
   a pattern generator unit to generate a test pattern for the integrated circuit; and
   a programmable state machine coupled to the pattern generator unit to control a test sequence during testing of the integrated circuit.

7. The integrated circuit of claim 6 further including a pattern recognition unit coupled to the programmable state machine, the pattern recognition unit to recognize a pattern during testing of the integrated circuit and to cause execution of a triggerable program in response to recognizing the pattern.

8. The integrated circuit of claim 5 further comprising:
   a host memory coupled to the programmable logic analyzer unit, wherein the vector storage memory is included within the host memory.

9. The integrated circuit of claim 1 wherein the input clock signal is received from a clock external to the integrated circuit.

10. The integrated circuit of claim 1 further comprising:
    an internal scan chain coupled to the programmable logic analyzer unit, the internal scan chain to interconnect the programmable logic analyzer unit and a circuit to be tested on the integrated circuit.

11. The integrated circuit of claim 1 wherein the programmable logic analyzer unit is coupled to an internal circuit on the integrated circuit, the internal circuit being inaccessible by a pin on the integrated circuit, the programmable logic analyzer unit being capable of testing the functionality of the internal circuit.

12. The integrated circuit of claim 1 wherein the programmable logic analyzer unit comprises
    a signal typing control unit, the signal typing control unit to enable the logic analyzer unit to drive and sense a plurality of different types of signals, the plurality of different types of signals including at least one of edge-triggered, level-sensitive, positive precharged, negative precharged and tri-stated signals.

13. A method comprising:
    selectively coupling a logic analyzer control unit on an integrated circuit to a first circuit on the integrated circuit to be tested;
    the logic analyzer unit retrieving a signal vector from a memory on the integrated circuit;
    the logic analyzer unit applying the signal vector to an input of the first circuit on the integrated circuit;
    programmably shifting an edge of a clock signal using circuitry on the integrated circuit to generated a shifted clock signal, the shifted clock signal being used to time an aspect of testing the first circuit; and
    the logic analyzer unit sensing a response vector from an output of the first circuit at a second circuit on the integrated circuit.

14. The method of claim 13 wherein
    the signal vector is applied to the input of the first circuit using the shifted clock signal.

15. The method of claim 13 further comprising:
    recognizing a predetermined signal pattern on the integrated circuit; and
    triggering a program stored on the integrated circuit in response to recognizing the predetermined signal pattern.

16. The method of claim 13 further comprising:
    executing a program stored on the integrated circuit after manufacture of the integrated circuit to test a function of the integrated circuit.

17. The method of claim 13 further comprising:
    storing the response vector in the memory.

18. The method of claim 13 further comprising:
    measuring a response time of the circuit in reference to the shifted clock signal.

19. The method of claim 13 further comprising:
    determining a type of signal to be sensed, the type of signal being one of an edge-triggered, level-sensitive, positive precharged, negative precharged and tri-stated signal.

20. A desktop computer system comprising:
    a bus;
    an input device coupled to the bus;
    a display device coupled to the bus; and
    a processor coupled to the bus, the processor comprising:
       a host memory;
       a programmable logic analyzer unit coupled to the host memory, the programmable logic analyzer unit to test a function of the processor in response to input via the input device; and
       clock delay logic programmable by the logic analyzer unit to provide a shifted clock signal in response to receiving an input clock signal, the shifted clock signal to be provided to the programmable logic analyzer unit.

21. The computer system of claim 20 wherein the logic analyzer is programmable via the input device, and wherein a result of testing the function of the processor with the programmable logic analyzer is displayed using the output device.

22. The computer system of claim 21 wherein
    the host memory is further to receive and store after manufacture of the processor a program to be used by the programmable logic analyzer unit to test the function of the processor.

23. The computer system of claim 20 wherein
    the shifted clock signal is used by the programmable logic analyzer unit to test a margin associated with the function of the processor.

24. The computer system of claim 20 wherein the programmable logic analyzer unit further comprises
    a signal typing control unit, the signal typing control unit to be used to enable the programmable logic analyzer unit to drive and sense a plurality of different types of signals, the plurality of different types of signals including at least one of edge-triggered, level-sensitive, positive precharged, negative precharged and tri-stated signals.

* * * * *